United States Patent
Cui

(10) Patent No.: US 12,501,782 B2
(45) Date of Patent: Dec. 16, 2025

(54) ARRAY SUBSTRATE WITH SYMMETRICAL SUBPIXELGROUPS, DISPLAY PANEL AND DISPLAY DEVICE INCLUDING THE ARRAY SUBSTRATE

(71) Applicant: BOE Technology Group Co., Ltd., Beijing (CN)

(72) Inventor: Ying Cui, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 594 days.

(21) Appl. No.: 17/909,419

(22) PCT Filed: May 27, 2021

(86) PCT No.: PCT/CN2021/096264
§ 371 (c)(1),
(2) Date: Sep. 5, 2022

(87) PCT Pub. No.: WO2021/239042
PCT Pub. Date: Dec. 2, 2021

(65) Prior Publication Data
US 2023/0098247 A1   Mar. 30, 2023

(30) Foreign Application Priority Data
May 27, 2020   (CN) .......................... 202010463219.0

(51) Int. Cl.
*H10K 59/122*   (2023.01)
*H10K 59/35*    (2023.01)

(52) U.S. Cl.
CPC .......... *H10K 59/122* (2023.02); *H10K 59/353* (2023.02)

(58) Field of Classification Search
CPC ................................................... H10K 59/353
See application file for complete search history.

(56) References Cited

U.S. PATENT DOCUMENTS

2006/0033422 A1* 2/2006 Chao ................. H10K 59/353
                                                   313/500
2006/0220530 A1* 10/2006 Lee ................... H05B 44/00
                                                   313/500
(Continued)

FOREIGN PATENT DOCUMENTS

CN     105206643 A    12/2015
CN     106816449 A     6/2017
(Continued)

OTHER PUBLICATIONS

CN 202010463219.0 first office action.
PCT/CN2021/096264 international search report and written opinion.

*Primary Examiner* — Peter Bradford
(74) *Attorney, Agent, or Firm* — IPro, PLLC

(57) ABSTRACT

The embodiment of the present application provides an array substrate, display panel and display device. The array substrate includes: base substrate; a first effective light emitting region layer located on the base substrate, where the first effective light emitting region layer includes a plurality of first effective light emitting region columns, and a plurality of second effective light emitting region column and third effective light emitting region column symmetrically arranged on both sides of each first effective light emitting region column, where at least one first effective light emitting region column includes a plurality of first effective light emitting regions arranged along a first direction, two second effective light emitting regions and two third effective light emitting regions are respectively arranged on two sides of at least one first effective light emitting region, and the two second effective light emitting regions are symmetric along a first straight line; and the two third effective light emitting regions are symmetrical along the first straight line, the first straight line extending along a second direction and passing (Continued)

through the center point of the first effective light emitting region, the second direction being perpendicular to the first direction.

20 Claims, 17 Drawing Sheets

(56) References Cited

U.S. PATENT DOCUMENTS

| | | | |
|---|---|---|---|
| 2011/0291549 A1* | 12/2011 | Kim | H10K 59/353 |
| | | | 313/504 |
| 2016/0035807 A1* | 2/2016 | Shi | H10K 10/462 |
| | | | 257/40 |
| 2016/0260786 A1 | 9/2016 | Shi et al. | |
| 2017/0004751 A1* | 1/2017 | Seo | G09G 3/3233 |
| 2017/0025483 A1 | 1/2017 | Kwon | |
| 2021/0135149 A1 | 5/2021 | Xin et al. | |
| 2021/0143236 A1* | 5/2021 | Kim | H10K 59/352 |

FOREIGN PATENT DOCUMENTS

| | | |
|---|---|---|
| CN | 109768182 A | 5/2019 |
| CN | 109904193 A | 6/2019 |
| CN | 110400827 A | 11/2019 |
| CN | 110634934 A | 12/2019 |
| CN | 110752243 A | 2/2020 |
| CN | 111599942 A | 8/2020 |

* cited by examiner

ARRAY SUBSTRATE WITH SYMMETRICAL SUBPIXELGROUPS, DISPLAY PANEL AND DISPLAY DEVICE INCLUDING THE ARRAY SUBSTRATE

CROSS-REFERENCE TO RELATED APPLICATION

This application is the U.S. national phase of PCT Application PCT/CN2021/096264 filed on May 27, 2021, which claims the benefit of priority, Chinese Patent Application No. 202010463219.0, filed in China on May 27, 2020, the entire contents of which are hereby incorporated by reference.

TECHNICAL FIELD

The present application relates to displaying technical fields, and in particular to an array substrate, display panel and display device.

BACKGROUND

Organic light emitting diode (Organic Light-Emitting Diode, OLED) display technology is widely used and has good prospects because of its light, thin, bendable, high contrast, etc.

The structure of an OLED mainly includes anode and a cathode arranged opposite to each other, and an organic light-emitting material located between the node and the cathode. The efficiency and lifetime of the current blue light-emitting material are not as good as those of the red light-emitting material and the green light-emitting material. Therefore, the area of the blue sub-pixel is generally designed to be larger than those of the red sub-pixel and the green sub-pixel to compensate for the deficiency of the blue light-emitting material.

For the OLED product made by the inkjet printing method, during the process of inkjet printing drying to form a film, the solvent vapor evaporates quickly at the edge region of the droplet, which will cause the droplet to flow from the center to the solution of the edge, and this flow will drive the solute to migrate to the edge of the droplet and finally deposit on the edge, so as to form the deposition morphology with the thick center and thin edge, i. e. "coffee ring effect", thus making the film formation of the organic light emitting layer in the sub-pixel very uneven, which will lead to uneven light-emitting of the OLED device, thus affecting the display effect.

SUMMARY

In a first aspect, the embodiment of the present application provides an array substrate, where the array substrate includes:

a base substrate;
a first effective light emitting region layer located on the base substrate, where the first effective light emitting region layer includes a plurality of first effective light emitting region columns, and a plurality of second effective light emitting region columns and third effective light emitting region columns symmetrically arranged on both sides of each first effective light emitting region column, where at least one first effective light emitting region column includes a plurality of first effective light emitting regions arranged along a first direction, two second effective light emitting regions and two third effective light emitting regions are respectively arranged on two sides of at least one first effective light emitting region, and the two second effective light emitting regions are symmetric along a first straight line; and the two third effective light emitting regions are symmetrical along the first straight line, the first straight line extending along a second direction and passing through the center point of the first effective light emitting region, the second direction being perpendicular to the first direction.

Optionally, the array substrate further includes:
a first pixel definition layer located at the side of the first effective light emitting region layer away from the base substrate, where the first pixel definition layer includes a plurality of first openings, and each the first opening at least partially exposes any one of the first effective light emitting region, the second effective light emitting region or the third effective light emitting region; and
a second pixel definition layer located on the side of the first pixel definition layer away from the base substrate, where the second pixel definition layer includes a plurality of second openings, each of the second opening corresponds to at least two of the first openings, and the orthographic projection of at least two of the first openings on the base substrate is located within the orthographic projection of the second opening on the base substrate.

Optionally, the array substrate further includes:
an organic light emitting layer located within the second opening, at least two orthographic projection of the first opening corresponding to each to of the second opening on the base substrate is located in the orthographic projection of the organic light emitting layer on the base substrate, the organic light emitting layer includes a blue organic light emitting layer, a green organic light emitting layer and a red organic light emitting layer, the blue organic light emitting layer being in contact with the first effective light emitting region, the green organic light emitting layer being in contact with the second effective light emitting region, and the red organic light emitting layer being in contact with the third effective light emitting region.

Optionally, the thicknesses of the first pixel definition layer along the direction perpendicular to the base substrate is the first thickness, and the thicknesses of the second pixel definition layer along the direction perpendicular to the base substrate is the second thicknesses, and the first thicknesses is smaller than the second thicknesses.

Optionally, a second effective light emitting region column and/or a third effective light emitting region column are included between two adjacent first effective light emitting regions.

Optionally, the area of the first opening corresponding to the second effective light emitting region is equal to the area of the first opening corresponding to the third effective light emitting region, and the area of the first opening corresponding to the first effective light emitting region is 1.5-3 times the area of the first opening corresponding to the second effective light emitting region.

Optionally, the first opening corresponding to the first effective light emitting region is a rhombus, and the first opening corresponding to the second effective light emitting region and the first opening corresponding to the third effective light emitting region are parallelograms.

Optionally, the first opening corresponding to the first effective light emitting region is a regular hexagon, and the first opening corresponding to the second effective light emitting region and the first opening corresponding to the third effective light emitting region are bent shapes.

Optionally, the first opening corresponding to the first effective light emitting region is circular, and the first opening corresponding to the second effective light emitting region and the first opening corresponding to the third effective light emitting region are arc-shaped.

Optionally, the array substrate further includes: an auxiliary layer located between the base substrate and the first effective light emitting region layer, the auxiliary layer including a plurality of ancillary structures, each of the ancillary structure being provided with one of the first effective light emitting region, a second effective light emitting region or one of the third effective light emitting region, the first effective light emitting region, the second effective light emitting region or the third effective light emitting region covering a side surface of the ancillary structure and a face away from the base substrate; the first pixel definition layer covers at least portion of the first effective light emitting region, or the second effective light emitting region, or the third effective light emitting region located at the side surface of the ancillary structure.

Optionally, the array substrate further includes a second effective light emitting region layer located on a side of the organic light emitting layer away from the base substrate, where the first effective light emitting region layer serves as an anode layer and the second effective light emitting region layer serves as a cathode layer.

Optionally, the orthographic projection of the second opening on the base substrate covers the orthographic projection of the first opening on the base substrate corresponding to one of the first effective light emitting region column, or a second effective light emitting region column, or a third effective light emitting region column.

Optionally, the material of the first pixel definition layer is a lyophilic material and the material of the second pixel definition layer is a lyophobic material.

In a second aspect, the embodiment of the present application provides a display panel including an array substrate as described above.

In a third aspect, the embodiment of the present application provides a display device, the display device including a display panel as described above.

Additional aspects and advantages of the present application will be set forth in part in the description which follows and will be obvious from the description, or may be learned by practice of the present application.

BRIEF DESCRIPTION OF THE DRAWINGS

The foregoing and/or additional aspects and advantages of the present application will become apparent and more readily appreciated from the following description of embodiment, taken in conjunction with the accompanying drawings of which.

REFERENCE NUMERALS

Figure 1:
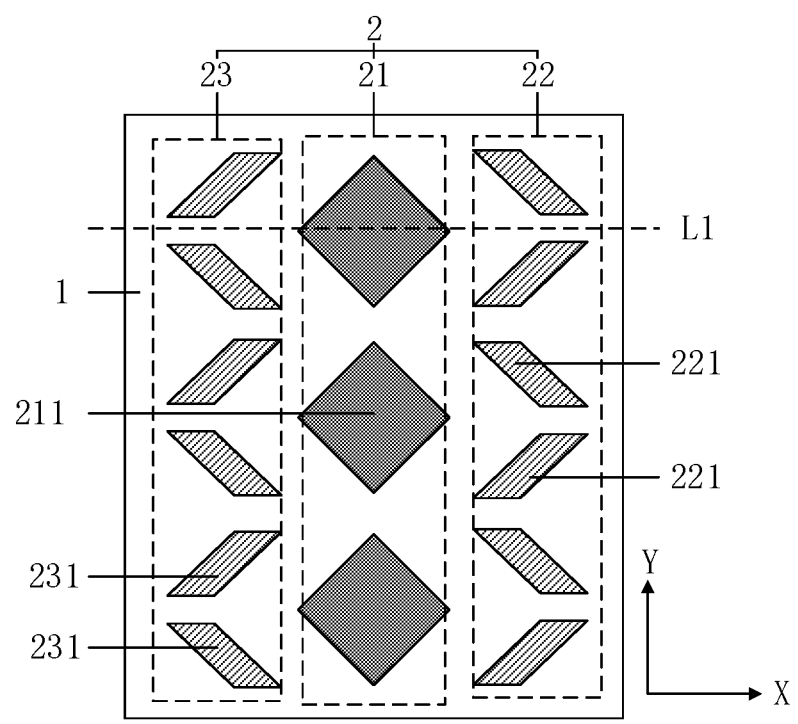
FIG. 1 is a partial top structural diagram of a first effective light emitting region layer in an array substrate according to an embodiment of the present application.

1—base substrate; 2—first effective light emitting region layer; 21—first effective light emitting region column; 211—first effective light emitting region; 22—second effective light emitting region column; 221—second effective light emitting region; 23—third effective light emitting region column; 231—third effective light emitting region; 3—first pixel definition layer; 31—first opening; 4—second pixel definition layer; 41—a second opening; 5—organic light emitting layer; 51—blue organic light-emitting material; 52—green organic light-emitting material; 53—red organic light-emitting material; 6—auxiliary layer; 61—ancillary structure; 7—second effective light emitting region layer;

R—red sub-pixel; G—green sub-pixel; B—blue sub-pixel;

L—first straight line;

X—second direction; Y—first direction.

DETAILED DESCRIPTION

Reference will now be made in detail to the present application, examples of which are illustrated in the accompanying drawings, where like reference numerals refer to the same or similar elements throughout the several views, or elements having the same or similar functionality. Further, if a detailed description of known technology is not necessary to illustrate the features of the present application, it is omitted. The embodiments described below by referring to the figures is exemplary only and should not be construed as limiting the present application.

A person skilled in the technical field will understand that, unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the prior art and will not be interpreted in an idealized or overly formal sense unless expressly so defined herein.

As used herein, the singular forms "a", "an", and "the" are intended to include the plural forms as well, unless expressly stated otherwise. As used herein, the singular forms "a", "an", and "the" are intended to include the plural forms as well. It will be further understood that the terms "include", "comprise" and/or "including" and "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes all or any cell and all combinations of one or more of the associated listed items.

The inventors of the present application consider that the efficiency and lifetime of the current blue light-emitting material is not as good as the efficiency and lifetime of the red light-emitting material and the green light-emitting material, and therefore the area of the blue sub-pixel is usually designed to be larger than the area of the red sub-pixel and the green sub-pixel to compensate for the deficiency of the blue light-emitting material. However, designing the area of blue sub-pixel slightly larger will affect the resolution of display device, which is not conducive to the improvement of display device resolution.

For the OLED product made by the inkjet printing method, during the process of inkjet printing drying to form a film, the solvent vapor evaporates quickly at the edge region of the droplet, which will cause the droplet to flow from the center to the solution of the edge, and this flow will drive the solute to migrate to the edge of the droplet and finally deposit on the edge, so as to form the deposition morphology with the thick center and thin edge, namely "coffee ring effect", thus making the film formation of the organic light emitting layer in the sub-pixel very uneven, which will lead to uneven light-emitting of the OLED device, thus affecting the display effect.

The present application provides array substrate, display panel and display device, aiming to solve the above technical problem of the prior art.

The technical solution of the present application and how the technical solution of the present application solves the above-mentioned technical problem are described in detail below in specific embodiment.

The embodiment of the present application provides an array substrate, and as shown in FIGS. 1-7, the array substrate provided by the present embodiment includes a base substrate 1, a first effective light emitting region layer 2 located on the base substrate 1, a first pixel definition layer 3 located on the side of the first effective light emitting region layer 2 away from the base substrate 1, a second pixel definition layer 4 located on the side of the first pixel definition layer 3 away from the base substrate 1, and an organic light emitting layer 5.

The first effective light emitting region layer 2 includes a plurality of first effective light emitting region columns 21; and a plurality of second effective light emitting region columns 22 and third effective light emitting region column 23 symmetrically arranged on both sides of each first effective light emitting region column 21, where at least one first effective light emitting region column 21 includes a plurality of first effective light emitting regions 211 arranged along a first direction Y, two second effective light emitting regions 221 and two third effective light emitting regions 231 are respectively arranged on two sides of at least one first effective light emitting region 211, and the two second effective light emitting regions 221 are symmetric along a first straight line L1; and the two third effective light emitting regions 231 are symmetrical along the first straight line L1, the first straight line L1 extending along a second direction X and passing through the center point of the first effective light emitting regions 211, the second direction X being perpendicular to the first direction Y.

The first pixel definition layer 3 includes a plurality of first openings 31 adapted to the shape of the first effective light emitting regions 211, or the second effective light emitting regions 221, or the third effective light emitting regions 231, each first opening 31 at least partially exposing any one of the first effective light emitting regions 211, the second effective light emitting regions 221, or the third effective light emitting regions 231; and the second pixel definition layer 4 includes a plurality of second openings 41, each second opening 41 corresponding to at least two first openings 31, and the orthographic projection of the at least two first openings 31 on the base substrate is located within the orthographic projection of the second openings 41 on the base substrate.

The organic light emitting layer 5 is located in the second opening 41. The orthographic projection of at least two first openings 31 corresponding to each second opening 41 on the base substrate is located in the orthographic projection of the organic light emitting layer 5 on the base substrate, the organic light emitting layer 5 includes a blue organic light emitting layer 51, a green organic light emitting layer 52 and a red organic light emitting layer 53, the blue organic light emitting layer 51 is in contact with the first effective light emitting region 211 and the green organic light emitting layer 52 is in contact with the second effective light emitting region 221. The red organic light emitting layer 53 is in contact with the third effective light emitting region 231.

Figure 8:
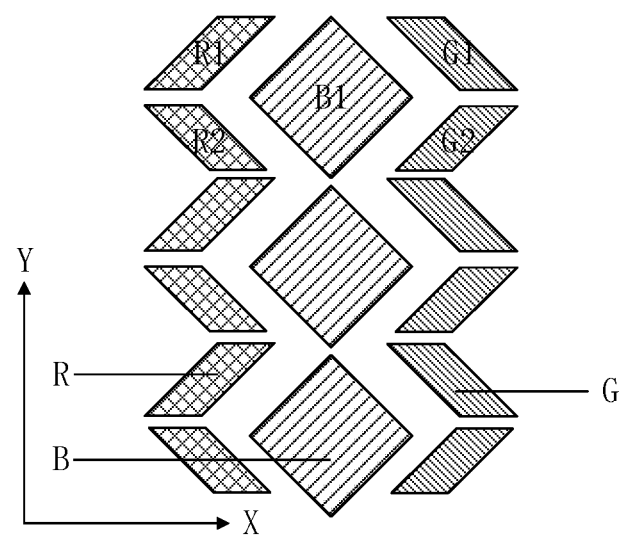
FIG. 8 is a partial schematic view of a pixel arrangement of an array substrate according to an embodiment of the present application.

Specifically, the array substrate provided by the present embodiment corresponds to the pixel arrangement as shown in FIG. 8. With reference to FIG. 1, the first effective light emitting region 211, the second effective light emitting region 221 and the third effective light emitting region 231 correspond to blue sub-pixel B, green sub-pixel G and red sub-pixel R, respectively. The blue sub-pixel B1 forms a display pixel with the red sub-pixel R1 and the green sub-pixel G1, and the blue sub-pixel B1 also forms a display pixel with the red sub-pixel R2 and the green sub-pixel G2, namely, the red sub-pixel R1 and the red sub-pixel R2, and the green sub-pixel G1 and the green sub-pixel G2 share the same blue sub-pixel B1.

An array substrate provided by the present embodiment, where two second effective light emitting regions 221 and two third effective light emitting regions 231 are arranged around a first effective light emitting region 211; in addition, the first effective light emitting region 211 corresponds to a blue sub-pixel B, the second effective light emitting region 221 corresponds to a green sub-pixel G, and the third effective light emitting region 231 corresponds to a red sub-pixel R; the two red sub-pixels R and two green sub-pixels G can share a blue sub-pixel B, and the sharing of the sub-pixels is beneficial to improving the resolution of the display device; at the same time, the first pixel definition layer 3 is used to prevent a short circuit from occurring between each effective light emitting region included in the first effective light emitting region layer 2. Using a second pixel definition layer 4 to prevent ink (solution of organic light emitting layer material) from mixing, so that inks of a plurality of sub-pixels forming the same color are flowable within the region defined by the corresponding second opening 41; this is advantageous in that the thicknesses of the organic light emitting layer corresponding to each first opening 31 tends to be uniform, that is, the uniformity of the thicknesses of the organic light emitting layer of each sub-pixel is improved, thereby improving the display effect of the display device.

Figure 6:
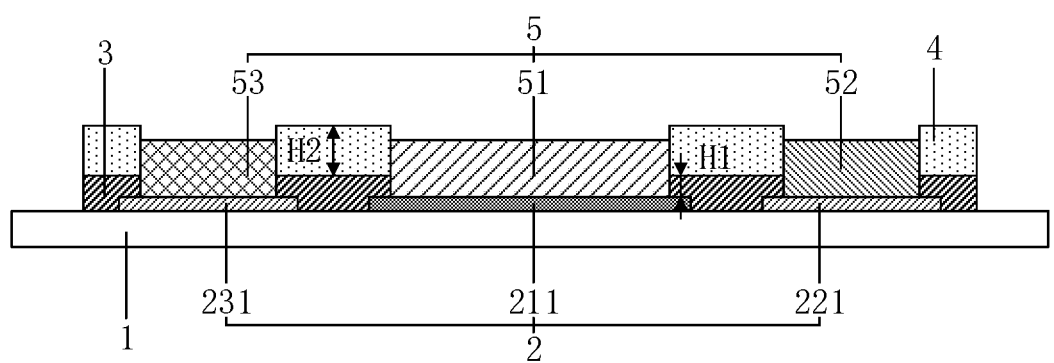
FIG. 6 shows a cross-sectional structural diagram of the array substrate shown in FIG. 5 along line A-A.
Figure 7:
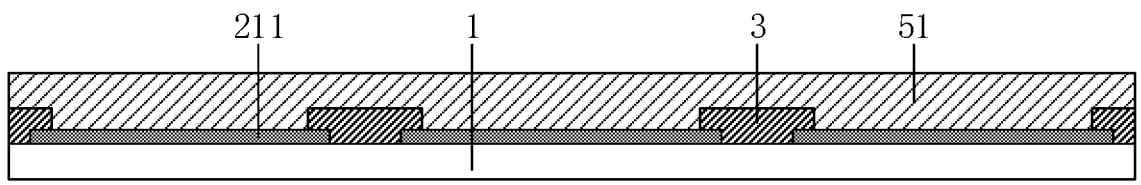
FIG. 7 shows a cross-sectional structural diagram of the array substrate shown in FIG. 5 along line B-B.

Optionally, as shown in FIG. 6, the thicknesses of the first pixel definition layer 3 along the direction perpendicular to the base substrate is a first thicknesses H1, namely, the height difference between the side of the first effective light emitting region 211 layer 2 away from the base substrate and the side of the first pixel definition layer 3 away from the base substrate is H1; the thicknesses of the second pixel definition layer 4 along the direction perpendicular to the base substrate is a second thicknesses H2, namely, the height difference between the side of the first pixel definition layer 3 away from the base substrate 1 and the side of the second pixel definition layer 4 away from the base substrate 1 is H2, and the first thicknesses H1 is smaller than the second thicknesses H2.

The array substrate provided by the present embodiment is designed to make the first thicknesses H1 to be smaller than the second thicknesses H2, which is advantageous to smoothen the circulation of the ink within the region defined by the second opening 41, so as to further improve the uniformity of the thicknesses of each sub-pixel's organic light emitting layer.

Figure 2:
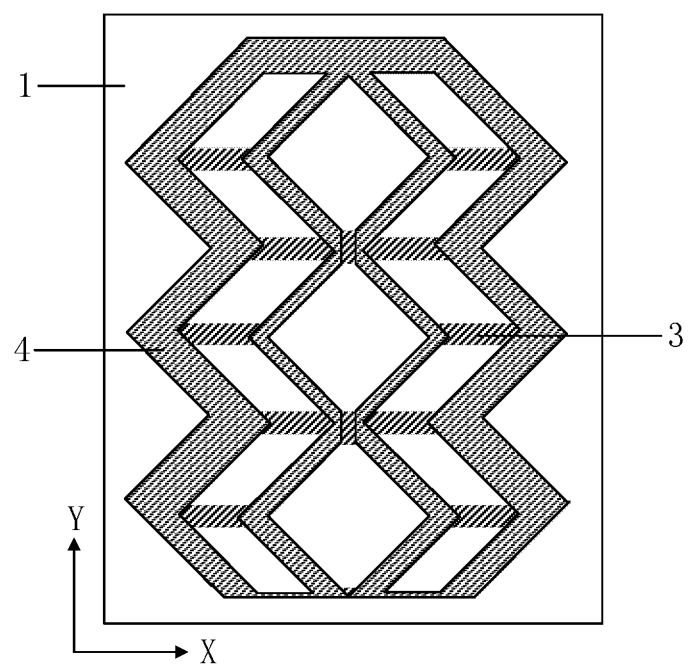
FIG. 2 is a schematic top view of a pixel defining structure according to an embodiment of the present application.
Figure 3:
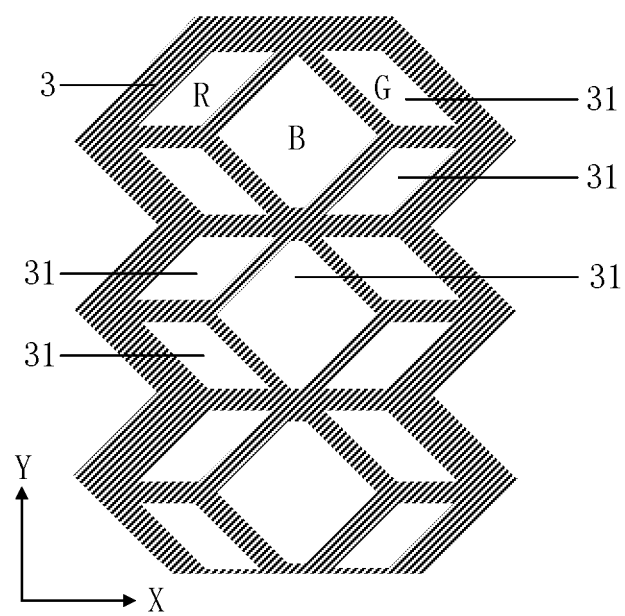
FIG. 3 is a schematic top view of a first pixel definition layer according to an embodiment of the present application.
Figure 4:
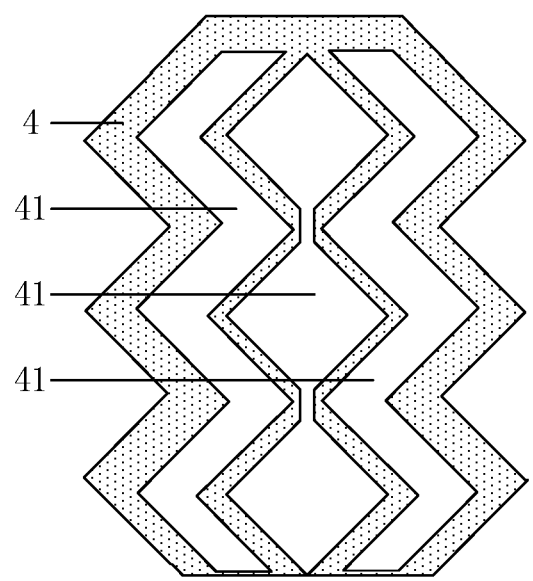
FIG. 4 is a schematic top view of a second pixel definition layer according to an embodiment of the present application.
Figure 5:
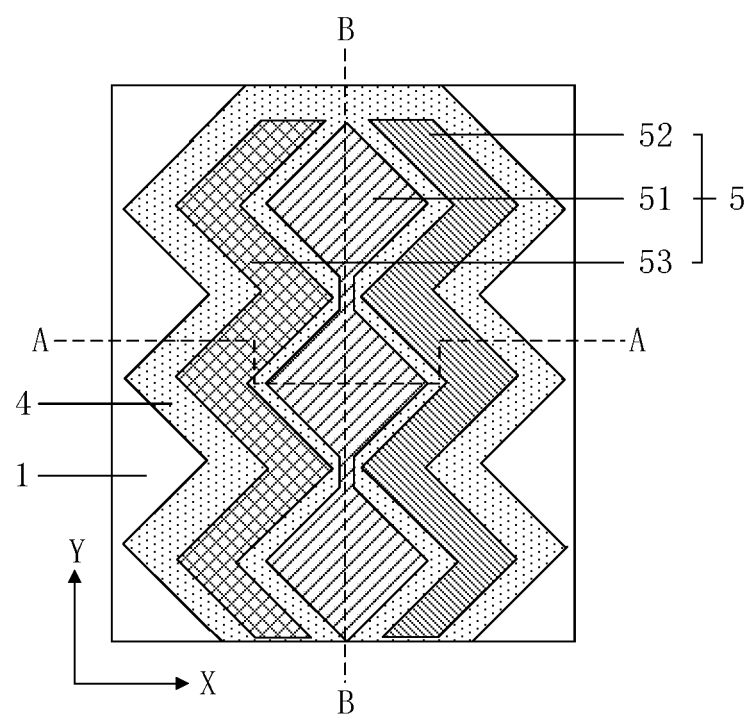
FIG. 5 is a partial top structural diagram of an array substrate structural diagram according to an embodiment of the present application.

Optionally, as shown in FIGS. 2-4, in the array substrate provided by the present embodiment, the orthographic projection of the second opening 41 on the base substrate covers the orthographic projection of a first opening 31 on the base substrate corresponding to a first effective light emitting region column 21, or a second effective light emitting region column 22, or a third effective light emitting region column 23.

In the array substrate provided by the present embodiment, a column of sub-pixels of the same color corresponds to a second opening 41, so that the ink of the same column of sub-pixels can circulate within a second opening 41, thereby improving the thicknesses uniformity of the organic light emitting layer of the sub-pixel as much as possible.

Optionally, as shown in FIGS. 1 and 3, the area of the first opening 31 corresponding to the second effective light emitting region 221 is equal to the area of the first opening 31 corresponding to the third effective light emitting region 231, and the area of the first opening 31 corresponding to the first effective light emitting region 211 is 1.5-3 times the area of the first opening 31 corresponding to the second effective light emitting region 221. That is, the area of blue sub-pixel B is 1.5-3 times the area of red sub-pixel R (or green sub-pixel G).

Preferably, the area of the first opening 31 corresponding to the first effective light emitting region 211 is twice the area of the first opening 31 corresponding to the second effective light emitting region 221. That is, the area of blue sub-pixel B is twice the area of red sub-pixel R (or green sub-pixel G).

Since the efficiency and lifetime of the organic light-emitting material of blue sub-pixel B are low, the improved pixel arrangement structure of this embodiment makes the area of blue sub-pixel B larger, which is beneficial to balance the brightness of sub-pixels in different colors and improve the lifetime of display device.

In specific implementation, the blue sub-pixel B can be designed into different shapes, and the shapes of the red sub-pixel R and the green sub-pixel G are also adaptively designed according to the shape of the blue sub-pixel B, that is, the first openings 31 corresponding to the first effective light emitting region 211, the second effective light emitting region 221 and the third effective light emitting region 231 are respectively designed into different shapes.

In some specific embodiments, as shown in FIGS. 2-4, the first opening 31 corresponding to the first effective light emitting region 211 is a rhombus, and the first opening 31 corresponding to the second effective light emitting region 221 and the first opening 31 corresponding to the third effective light emitting region 231 are parallelograms.

Figure 9:
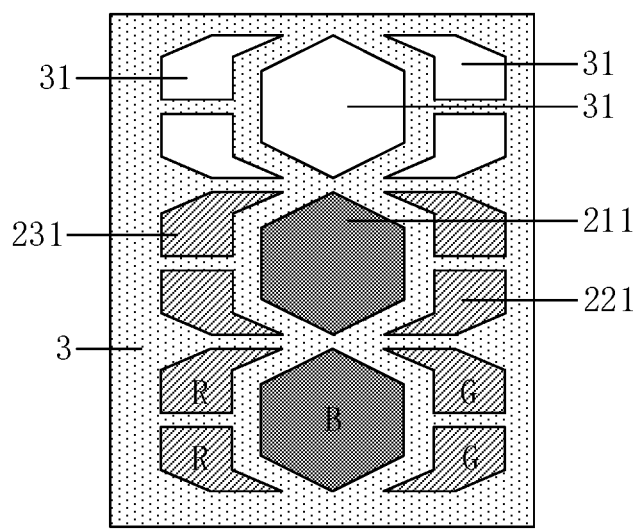
FIG. 9 is a partial structural diagram of a first effective light emitting region layer and a first pixel definition layer in an array substrate according to an embodiment of the present application.

In some specific embodiment, as shown in FIG. 9, the first opening 31 corresponding to the first effective light emitting region 211 is a regular hexagon, and the first opening 31 corresponding to the second effective light emitting region 221 and the first opening 31 corresponding to the third effective light emitting region 231 are bent shapes.

Figure 10:
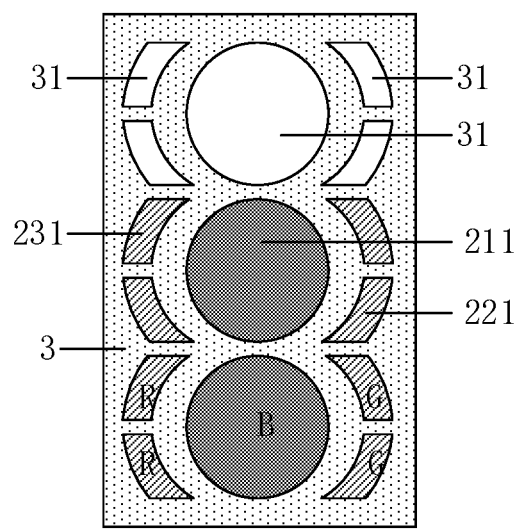
FIG. 10 is a partial structural diagram of a first effective light emitting region layer and a first pixel definition layer in another array substrate according to an embodiment of the present application.

In some specific embodiment, as shown in FIG. 10, the first opening 31 corresponding to the first effective light emitting region 211 is circular, and the first opening 31 corresponding to the second effective light emitting region 221 and the first opening 31 corresponding to the third effective light emitting region 231 are arc-shaped.

In specific implementation, one red sub-pixel R and one green sub-pixel G may cooperate with only one blue sub-pixel B to form a display pixel, and one red sub-pixel R and one green sub-pixel G may also be shared by two blue sub-pixels B, as described in more detail below.

Figure 11:
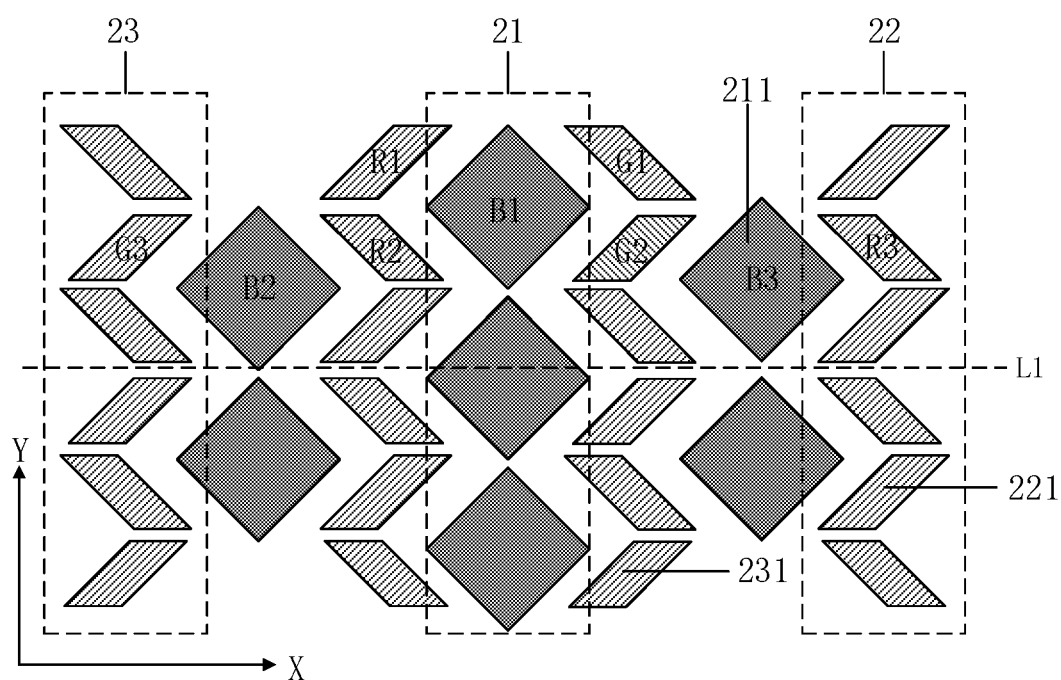
FIG. 11 is a schematic diagram of a particular pixel arrangement according to an embodiment of the present application.

In some specific embodiment, as shown in FIG. 11, the array substrate provided by the present embodiment may include only a second effective light emitting region column 22 or a third effective light emitting region column 23 between adjacent first effective light emitting region columns 21. That is, only one red pixel column or one green pixel column is included between adjacent blue pixel columns. In this case, one red sub-pixel R and one green sub-pixel G are shared by two blue sub-pixels B.

Specifically, red sub-pixel R1, green sub-pixel G1 and blue sub-pixel B1 form a display pixel, red sub-pixel R2, green sub-pixel G2 also form a display pixel with blue sub-pixel B1, while red sub-pixel R2 also forms a display pixel with green sub-pixel G3, blue sub-pixel B2 also forms a display pixel with red sub-pixel R3, blue sub-pixel B3.

Figure 12:
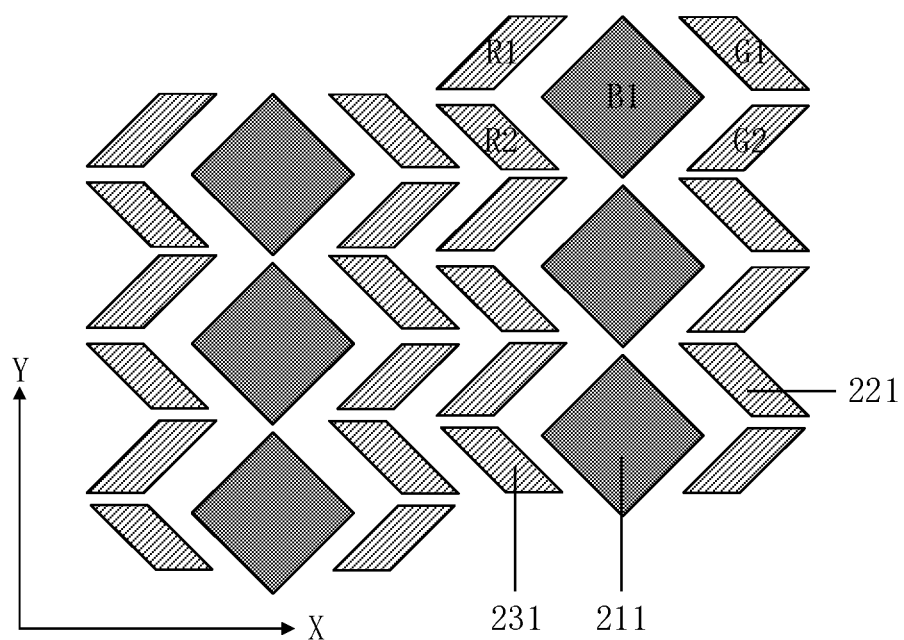
FIG. 12 is a schematic diagram of a particular pixel arrangement according to an embodiment of the present application.

In other specific embodiments, as shown in FIG. 12, the present embodiment provides an array substrate that alternatively includes a first effective light emitting region column 21 and a second effective light emitting region column 22 between adjacent columns 21 of the first effective light emitting region 211. That is, a red pixel column 20 and a green pixel column 30 are included between adjacent blue pixel columns 10. In this case, one red sub-pixel R and one green sub-pixel G may cooperate with only one blue sub-pixel B to form a display pixel.

Specifically, red sub-pixel R1, green sub-pixel G1 constitute a display pixel only with blue sub-pixel B1, and red sub-pixel R2, green sub-pixel G2 also constitute a display pixel only with blue sub-pixel B1. In driving, when red sub-pixel R1 and green sub-pixel G1 are driven for light-emitting, blue sub-pixel B1 is driven for light-emitting with a corresponding power, and when red sub-pixel R2 and green sub-pixel G2 are driven for light-emitting, blue sub-pixel B1 is also driven for light-emitting with a corresponding power. By the above-described construction of a common blue sub-pixel, the resolution of the display device can be improved with the application of a larger blue sub-pixel.

Figure 13:
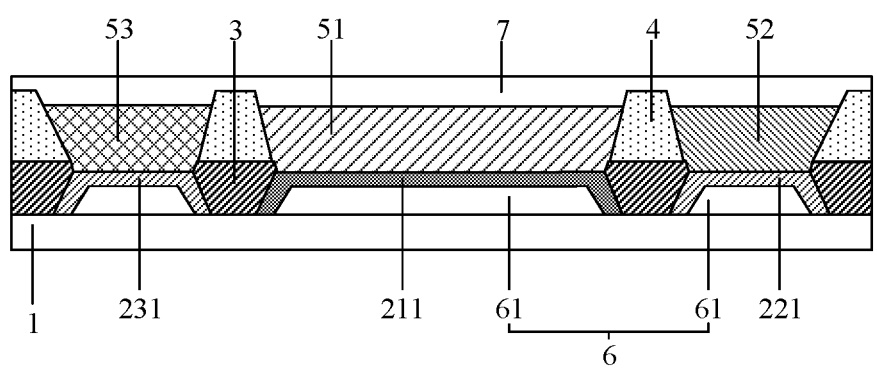
FIG. 13 is another cross-sectional structural diagram of the array substrate shown in FIG. 5 along line A-A.
Figure 14:
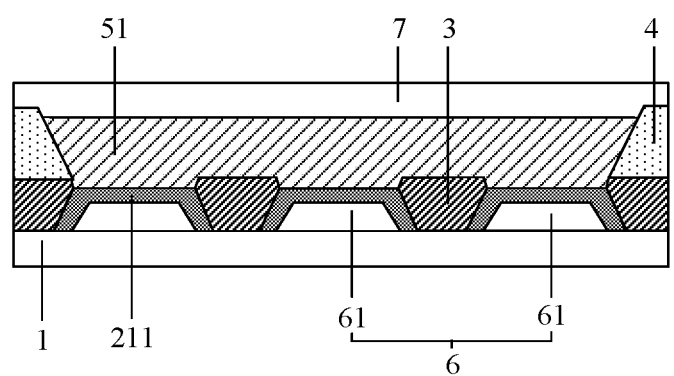
FIG. 14 is another cross-sectional structural diagram of the array substrate shown in FIG. 5 along line B-B.

Optionally, as shown in FIGS. 13 and 14, the array substrate provided by the present embodiment further includes an auxiliary layer 6 located between the base substrate and the first effective light emitting region 211 layer 2, the auxiliary layer 6 including a plurality of ancillary structures 61, each ancillary structure 61 is provided with a first effective light emitting region 211, a second effective light emitting region 221 or a third effective light emitting region 231; a first effective light emitting region 211, a second effective light emitting region 221 or a third effective light emitting region 231 covers a side surface of the ancillary structure 61 and the side away from the base substrate; the first pixel definition layer 3 covers at least portion of the first effective light emitting region 211, or the second effective light emitting region 221 or the third effective light emitting region 231 located at the side surface of the ancillary structure 61.

Specifically, as shown in FIGS. 13 and 14, the array substrate provided by the present embodiment further includes a second effective light emitting region layer 7 located on the side of the organic light emitting layer 5 away from the base substrate 1. Typically, a first effective light emitting region layer 2 acts as an anode layer and a second effective light emitting region layer 7 acts as a cathode layer.

The array substrate provided by the present embodiment advantageously reduces the resistance of the first pixel definition layer 3 to ink circulation by providing an auxiliary layer 6 between the base substrate 1 and the first effective light emitting region layer 2 by means of the ancillary structure 61 so that the first pixel definition layer 3 is located at least partially below the upper surface of the first effective light emitting region layer 2, thereby advantageously improving the uniformity of the thicknesses of each sub-pixel's organic light emitting layer.

Optionally, the material of the first pixel definition layer 3 is a lyophilic material and the material of the second pixel definition layer 4 is a lyophobic material. The material of the first pixel definition layer 3 is a lyophilic material, facilitating the solution of an organic light-emitting material to fill in the corresponding position more easily, and the material of the second pixel definition layer 4 is a lyophobic material, which can better prevent the solution of organic light-emitting material of different colors from mixing.

The array substrate provided by the present embodiment also includes a pixel driving circuit, and the pixel driving circuit includes a thin-film transistor and a capacitor, etc. Since the inventive point of the present application does not relate to the design of the pixel driving circuit, a detailed description thereof will not be provided herein.

Figure 15:
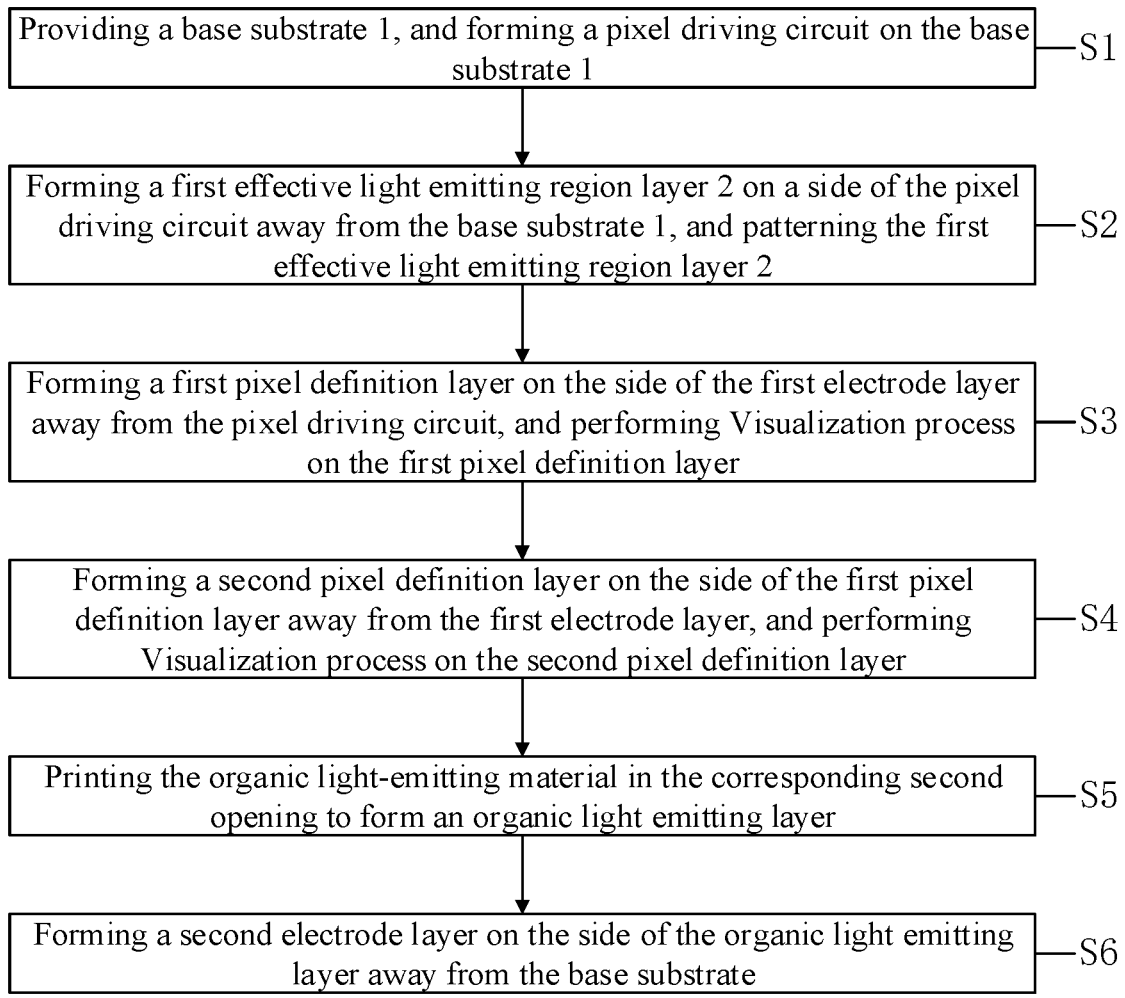
FIG. 15 is a flow diagram of a fabrication method of an array substrate according to an embodiment of the present application.

The array substrate provided by the present embodiment can be made by a method as shown in FIG. 15, including:

S1: Providing a base substrate 1, and forming a pixel driving circuit on the base substrate 1.

S2: Forming a first effective light emitting region layer 2 on a side of the pixel driving circuit away from the base substrate 1, and patterning the first effective light emitting region layer 2. The patterned first effective light emitting region layer 2 includes a plurality of first effective light emitting region columns 21; and a plurality of second effective light emitting region columns 22 and third effective light emitting region columns 23 symmetrically arranged on both sides of each first effective light emitting region column 21, where at least one first effective light emitting region column 21 includes a plurality of first effective light emitting regions 211 arranged along a first direction Y, two second effective light emitting regions 221 and two third effective light emitting regions 231 are respectively arranged on two sides of at least one first effective light emitting region 211, and the two second effective light emitting regions 221 are symmetric along a first straight line L1; and the two third effective light emitting regions 231 are symmetrical along the first straight line L1, the first straight line L1 extending along a second direction X and passing through the center point of the first effective light emitting region 211, the second direction X being perpendicular to the first direction Y.

S3: Forming a first pixel definition layer 3 on the side of the first effective light emitting region layer 2 away from the pixel driving circuit, and performing Visualization process on the first pixel definition layer 3. The patterned first pixel definition layer 3 includes a plurality of first openings 31 adapted to the shape of the first effective light emitting region 211, or the second effective light emitting region 221, or the third effective light emitting region 231, each first opening 31 at least partially exposing any one of the first effective light emitting region 211, the second effective light emitting region 221, or the third effective light emitting region 231.

S4: Forming a second pixel definition layer 4 on the side of the first pixel definition layer 3 away from the first effective light emitting region layer 2, and performing Visualization process on the second pixel definition layer 4. The patterned second pixel definition layer 4 includes a plurality of second opening 41, where each second opening 41 corresponds to at least two first opening 31, and the orthographic projection of the at least two first opening 31 on the base substrate is located within the orthographic projection of the second opening 41 on the base substrate.

S5: Forming an organic light emitting layer 5. Specifically, the organic light emitting layer 5 is located within the second opening 41. The orthographic projection of at least two first opening 31 corresponding to each second opening 41 on the base substrate is located in the orthographic projection of the organic light emitting layer 5 on the base substrate, the organic light emitting layer 5 includes a blue organic light emitting layer 51, a green organic light emitting layer 52 and a red organic light emitting layer 53, the blue organic light emitting layer 51 is in contact with the first effective light emitting region 211 and the green organic light emitting layer 52 is in contact with the second effective light emitting region 221. The red organic light emitting layer 53 is in contact with a third effective light emitting region 231.

S6: Forming a second effective light emitting region layer 6 on the side of the organic light emitting layer 5 away from the base substrate 1.

The array substrate in the above-mentioned embodiment can be obtained by the method for manufacturing the array substrate provided by the present embodiment, and since the organic light-emitting material in the same pixel column forms an integral body, the uniformity of the film-forming thicknesses of the organic light-emitting material of each sub-pixel is improved, which is beneficial to improving the display effect of the display device; furthermore, sharing the same blue sub-pixel B with two red sub-pixels R and two green sub-pixels G is advantageous for designing the area of the blue sub-pixel B to be larger than that of the red sub-pixel R and the green sub-pixel G, so as to compensate for the problems of a lower light efficiency rate of the blue light-emitting material and a shorter life of the blue light-emitting material, so as to improve the display effect and the service life of the display panel.

Figure 16:
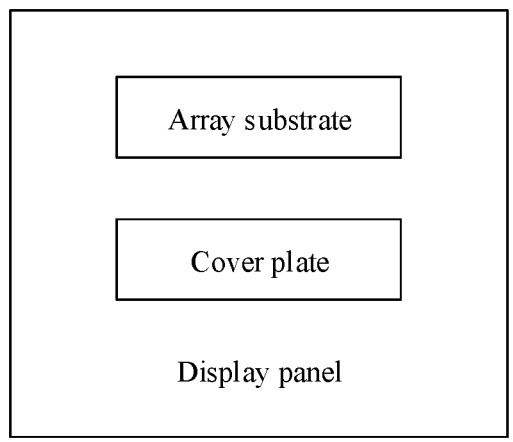
FIG. 16 is a frame structural diagram of a display panel according to an embodiment of the present application.

Based on the same inventive concept, the embodiment of the present application also provides a display panel, as shown in FIG. 16, the display panel includes the array substrate in the above-mentioned embodiment, and has the beneficial effects of the array substrate in the above-mentioned embodiment, which will not be described in detail herein.

The display panel provided by the present embodiment further includes an encapsulation structure, and the encapsulation structure is used for protecting the display panel, and in particular, the encapsulation structure may be a thin film encapsulation structure to prevent water and oxygen array substrate from eroding.

In addition, the display panel provided by the present embodiment may also include a cover plate for further protection of the display panel.

Figure 17:
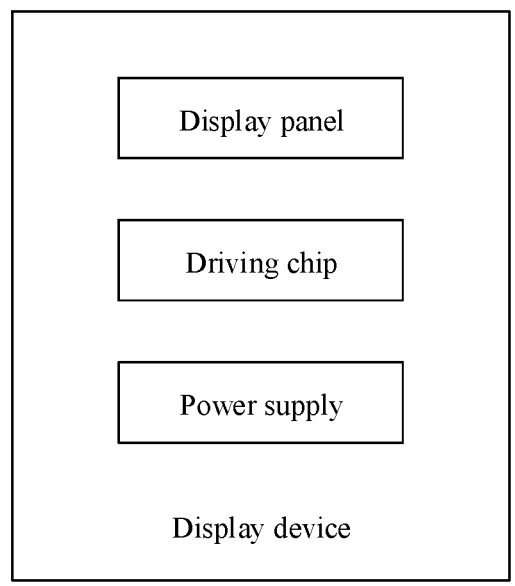
FIG. 17 is a frame structural diagram of a display device according to an embodiment of the present application.

Based on the same inventive concept, the embodiment of the present application also provides a display device, as shown in FIG. 17, where the display device including the display panel in the embodiment, has the above-mentioned beneficial effects of the display panel in the embodiment, which will not be described in detail herein.

Specifically, the display device provided by the present embodiment also includes a driving chip and a power supply, where the driving chip provides driving signal for the display panel and the power supply provides power for the display panel.

With the embodiment of the present application, at least the following beneficial effects can be achieved:

In the array substrate, display panel and display device provided by the embodiment of the present application, two second effective light emitting regions and two third effective light emitting regions are provided around a first effective light emitting region, in addition, a first effective light emitting region corresponds to a blue sub-pixel, a second effective light emitting region corresponds to a green sub-pixel, and a third effective light emitting region corresponds to a red sub-pixel; a blue sub-pixel can be shared by two red sub-pixels and two green sub-pixels, and the sharing of the sub-pixels is beneficial to improving the resolution of the display device; at the same time, the first pixel definition layer is used to prevent a short circuit from occurring between each effective light emitting region included in the first effective light emitting region layer. A second pixel definition layer is used to prevent ink (solution of an organic light emitting layer material) from mixing, so that inks of a plurality of sub-pixels forming the same color are flowable within a region defined by a corresponding second opening; this is advantageous in that the thicknesses of the organic light emitting layer corresponding to each first opening tends to be uniform, that is, the uniformity of the thicknesses of the organic light emitting layer of each sub-pixel is improved, thereby improving the display effect of the display device.

Those skilled in the technical field will appreciate that the various operations, methods, steps, acts, schemes, etc. discussed in this application may be alternated, altered, combined, or deleted. Further, operations, methods, other steps, acts, schemes, etc. in the various operations, methods, schemes, etc. discussed in this application may be alternated, altered, rearranged, decomposed, combined, or deleted. Further, various operations, methods, steps, acts, schemes, etc. disclosed in the prior art may be alternated, altered, rearranged, decomposed, combined, or deleted.

In the description of the present application, it is to be understood that the orientation or position relationships indicated by the terms "center", "upper", "lower", "front", "back", "left", "right", "vertical", "horizontal", "top", "bottom", "inner", "outer" and the like are orientation or position relationships based on the illustrations in the drawings and are merely for convenience in describing the present application and to simplify the description, and do not indicate or imply that the referenced devices or elements must have a particular orientation, be constructed and operated in a particular orientation, and thus should not be construed as limiting the present application.

The terms "first" and "second" are used for descriptive purposes only and are not to be construed as indicating or implying relative importance or as implicitly designating the number of technical features indicated. Thus, a feature defined as "first" or "second" may explicitly or implicitly include one or more of the features. In the description of the present application, the meaning of "a plurality" is two or more unless otherwise specified.

In the description of the present application, it should be noted that, unless expressly stated or limited otherwise, the terms "mounted", "connected", and "linked" are to be interpreted broadly, and may, for example, be fixedly connected, detachably connected, or integrally connected; it can be directly connected or indirectly connected through an intermediate medium, and can be the communication between two elements. For a person skilled in the art, the specific meaning of the above terms in the present application can be understood in detail.

In the description of the specification, particular features, structures, material or characteristics may be combined in any suitable manner in any embodiment or example.

It should be understood that, although the various steps in the flowcharts of the figures are shown in order as indicated by the arrows, the steps are not necessarily performed in the order indicated by the arrows. The steps are performed in no strict order unless explicitly stated herein, and may be performed in other orders. Furthermore, at least a part of the steps in the flowchart of the figure may include a plurality of sub-steps or a plurality of stages, and these sub-steps or stages are not necessarily performed at the same time, but may be performed at different times, and the order of execution thereof is also not necessarily performed in turn, but may be performed in turn or in alternation with other steps or at least a part of the sub-steps or stages of other steps.

The above description is only a partial embodiment of the present application, and it should be noted that a person skilled in the art of the present technical field can make several improvements and modifications without departing from the principles of the present application, and these improvements and modifications should also be considered as protection ranges of the present application.

What is claimed is:

1. An array substrate, comprising:
   a base substrate;
   a first effective light emitting region layer located on the base substrate, wherein the first effective light emitting region layer comprises a plurality of first effective light emitting region columns, and a plurality of second effective light emitting region columns and third effective light emitting region columns symmetrically arranged on both sides of each first effective light emitting region column, wherein at least one first effective light emitting region column comprises a plurality of first effective light emitting regions arranged along a first direction, two second effective light emitting regions and two third effective light emitting regions are respectively arranged on two sides of each first effective light emitting region in the plurality of first effective light emitting regions, and the two second effective light emitting regions are symmetric along a first straight line; and the two third effective light emitting regions are symmetrical along the first straight line, the first straight line extending along a second direction and passing through the center point of the first effective light emitting region, the second direction being perpendicular to the first direction; and wherein the first effective light emitting region corresponds to a blue sub-pixel, each second effective light emitting region corresponds to a green sub-pixel, and each third effective light emitting region corresponds to a red sub-pixel.

2. The array substrate according to claim 1, further comprising:
a first pixel definition layer located at the side of the first effective light emitting region layer away from the base substrate, wherein the first pixel definition layer comprises a plurality of first openings, and each of the first openings at least partially exposes any one of the first effective light emitting region, the second effective light emitting region or the third effective light emitting region; and
a second pixel definition layer located on a side of the first pixel definition layer away from the base substrate, wherein the second pixel definition layer comprises a plurality of second openings, each of the second openings corresponds to at least two of the first openings, and the orthographic projection of at least two of the first openings on the base substrate is located within the orthographic projection of the second opening on the base substrate.

3. The array substrate according to claim 2, further comprising:
an organic light emitting layer located within the second opening, the orthographic projection of at least two of the first openings corresponding to each of the second openings on the base substrate is located within the orthographic projection of the organic light emitting layer on the base substrate, the organic light emitting layer comprises a blue organic light emitting layer, a green organic light emitting layer and a red organic light emitting layer, the blue organic light emitting layer being in contact with the first effective light emitting region, the green organic light emitting layer being in contact with the second effective light emitting region, and the red organic light emitting layer being in contact with the third effective light emitting region.

4. The array substrate according to claim 1, wherein the thicknesses of the first pixel definition layer along the direction perpendicular to the base substrate is a first thickness, and the thicknesses of the second pixel definition layer along the direction perpendicular to the base substrate is a second thickness, and the first thickness is smaller than the second thickness.

5. The array substrate according to claim 1, wherein a second effective light emitting region column and/or a third effective light emitting region column are arranged between adjacent first effective light emitting region columns.

6. The array substrate according to claim 2, wherein the area of the first opening corresponding to the second effective light emitting region is equal to the area of the first opening corresponding to the third effective light emitting region, and the area of the first opening corresponding to the first effective light emitting region is 1.5-3 times the area of the first opening corresponding to the second effective light emitting region.

7. The array substrate according to claim 2, wherein the first opening corresponding to the first effective light emitting region is a rhombus and the first opening corresponding to the second effective light emitting region and the first opening corresponding to the third effective light emitting region are parallelograms.

8. The array substrate according to claim 2, wherein the first opening corresponding to the first effective light emitting region is a regular hexagon, and the first opening corresponding to the second effective light emitting region and the first opening corresponding to the third effective light emitting region are bent shapes.

9. The array substrate according to claim 2, wherein the first opening corresponding to the first effective light emitting region is circular, and the first opening corresponding to the second effective light emitting region and the first opening corresponding to the third effective light emitting region are arc-shaped.

10. The array substrate according to claim 2, further comprising:
an auxiliary layer located between the base substrate and the first effective light emitting region layer, the auxiliary layer comprising a plurality of ancillary structures, each the ancillary structure being provided with one the first effective light emitting region, one second effective light emitting region or one the third effective light emitting region, the first effective light emitting region, the second effective light emitting region or the third effective light emitting region covering a side surface of the ancillary structure and a face away from the base substrate; and
the first pixel definition layer covers at least portion of the first effective light emitting region, or the second effective light emitting region, or the third effective light emitting region located at the side surface of the ancillary structure.

11. The array substrate according to claim 1, further comprising a second effective light emitting region layer located on the side of the organic light emitting layer away from the base substrate, wherein the first effective light emitting region layer serves as an anode layer and the second effective light emitting region layer serves as a cathode layer.

12. The array substrate according to claim 2, wherein the orthographic projection of the second opening on the base substrate covers the orthographic projection of the first opening on the base substrate corresponding to one of the first effective light emitting region column, or one of a second effective light emitting region column, or one of a third effective light emitting region column.

13. The array substrate according to claim 1, wherein
the material of the first pixel definition layer is a lyophilic material, and the material of the second pixel definition layer is a lyophobic material.

14. A display panel comprising an array substrate;
wherein the array substrate comprises:
a base substrate;
a first effective light emitting region layer located on the base substrate, wherein the first effective light emitting region layer comprises a plurality of first effective light emitting region columns, and a plurality of second effective light emitting region columns and third effective light emitting region columns symmetrically arranged on both sides of each first effective light emitting region column, wherein at least one first effective light emitting region column comprises a plurality of first effective light emitting regions arranged along a first direction, two second effective light emitting regions and two third effective light emitting regions are respectively arranged on two sides of each first effective light emitting region in the plurality of first effective light emitting regions, and the two second effective light emitting regions are symmetric along a first straight line; and the two third effective light emitting regions are symmetrical along the first straight line, the first straight line extending along a second direction and passing through the center point of the first effective light emitting region, the second direction being perpendicular to the first direction; and wherein the first effective light emitting region corresponds to a blue sub-pixel, each second effective light emitting region corresponds to a green sub-pixel, and each third effective light emitting region corresponds to a red sub-pixel.

15. A display device comprising the display panel of claim 14.

16. The display panel according to claim 14, further comprising:
a first pixel definition layer located at the side of the first effective light emitting region layer away from the base substrate, wherein the first pixel definition layer comprises a plurality of first openings, and each of the first openings at least partially exposes any one of the first effective light emitting region, the second effective light emitting region or the third effective light emitting region; and
a second pixel definition layer located on a side of the first pixel definition layer away from the base substrate, wherein the second pixel definition layer comprises a plurality of second openings, each of the second openings corresponds to at least two of the first openings, and the orthographic projection of at least two of the first openings on the base substrate is located within the orthographic projection of the second opening on the base substrate.

17. The display panel according to claim 16, further comprising:
an organic light emitting layer located within the second opening, the orthographic projection of at least two of the first openings corresponding to each of the second openings on the base substrate is located within the orthographic projection of the organic light emitting layer on the base substrate, the organic light emitting layer comprises a blue organic light emitting layer, a green organic light emitting layer and a red organic light emitting layer, the blue organic light emitting layer being in contact with the first effective light emitting region, the green organic light emitting layer being in contact with the second effective light emitting region, and the red organic light emitting layer being in contact with the third effective light emitting region.

18. The display panel according to claim 14, wherein the thicknesses of the first pixel definition layer along the direction perpendicular to the base substrate is a first thickness, and the thicknesses of the second pixel definition layer along the direction perpendicular to the base substrate is a second thickness, and the first thickness is smaller than the second thickness.

19. The display panel according to claim 14, wherein a second effective light emitting region column and/or a third effective light emitting region column are arranged between adjacent first effective light emitting region columns.

20. The display panel according to claim 14, wherein the area of the first opening corresponding to the second effective light emitting region is equal to the area of the first opening corresponding to the third effective light emitting region, and the area of the first opening corresponding to the first effective light emitting region is 1.5-3 times the area of the first opening corresponding to the second effective light emitting region.

* * * * *